(12) United States Patent
Lai

(10) Patent No.: US 9,076,684 B1
(45) Date of Patent: Jul. 7, 2015

(54) 3D MEMORY STRUCTURE AND MANUFACTURING METHOD OF THE SAME

(71) Applicant: Macronix International Co., Ltd., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/144,640

(22) Filed: Dec. 31, 2013

(51) Int. Cl.
*H01L 29/792* (2006.01)
*H01L 29/76* (2006.01)
*H01L 29/94* (2006.01)
*H01L 31/062* (2012.01)
*H01L 31/113* (2006.01)
*H01L 31/119* (2006.01)
*H01L 27/115* (2006.01)

(52) U.S. Cl.
CPC .... *H01L 27/11575* (2013.01); *H01L 27/11582* (2013.01)

(58) Field of Classification Search
CPC ....... H01L 29/792; H01L 29/76; H01L 29/94; H01L 31/062; H01L 31/113; H01L 31/119
USPC .................................... 257/324, 326; 438/591
See application file for complete search history.

(56) References Cited

U.S. PATENT DOCUMENTS

2012/0068255 A1* 3/2012 Lee et al. ...................... 257/324
2012/0199897 A1* 8/2012 Chang et al. .................. 257/314
2013/0341701 A1* 12/2013 Blomme et al. .............. 257/324
2014/0035025 A1* 2/2014 Kwak ........................... 257/324
2014/0241026 A1* 8/2014 Tanzawa ........................ 365/72

OTHER PUBLICATIONS

Ishiduki, et al.: "Optimal Device Structure for Pipe-shaped BiCS Flash Memory for Ultra High Density Storage Device with Excellent Performance and Reliability"; Center for Semiconductor Research & Development, Semiconductor Company, Toshiba Corporation; © 2009 IEEE.
Jang, et al.: "Vertical Cell Array using TCAT(Terabit Cell Array Transistor) Technology for Ultra High Density NAND Flash Memory"; 2009 Symposium on VLSI Technology Digest of Technical Papers; pp. 192-193.

\* cited by examiner

*Primary Examiner* — Phuc Dang
(74) *Attorney, Agent, or Firm* — McClure, Qualey & Rodack, LLP

(57) ABSTRACT

A 3D memory structure and a manufacturing method of the same are provided. The 3D memory structure includes a substrate, a plurality of stacked structures, a plurality of charge trapping layers, a plurality of bit lines, and a plurality of stair structures. The stacked structures are formed on the substrate, and each of the stacked structures includes a plurality of gates and a plurality of gate insulators alternately stacked on the substrate. The charge trapping layers are formed on the sidewalls of the stacked structures. The bit lines are arranged orthogonally over the stacked structures, the surfaces of the bit lines crossing the stacked structures for forming a plurality of memory elements. The stair structures, each electrically connected to the different gates, are stacked on the substrate.

18 Claims, 14 Drawing Sheets

3D MEMORY STRUCTURE AND MANUFACTURING METHOD OF THE SAME

BACKGROUND

1. Technical Field

The disclosure relates in general to a memory structure and a manufacturing method thereof, and particularly to a 3D memory structure having a 3D memory array and a manufacturing method thereof.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof is in need.

As such, it is desirable to develop a three-dimensional (3D) memory device with larger number of multiple stacked planes to achieve greater storage capacity, a small size, and yet having excellent property and stability.

SUMMARY

The disclosure is directed to a 3D memory structure and a manufacturing method thereof. In the embodiments, stairstep structures are electrically connected to different gates, and different planes of gates are selected by the stairstep structures, such that the area occupied by the whole memory array on the substrate (2D plane) can be reduced, and areas required for disposing contacts are reduced as well.

According to an embodiment of the present disclosure, a 3D memory structure is provided. The 3D memory structure includes a substrate, a plurality of stacked structure, a plurality of charge trapping layers, a plurality of bit lines, and a plurality of stairstep structures. The stacked structures are formed on the substrate, each of the stacked structures comprises a plurality of gates and a plurality of gate insulators alternately stacked on the substrate. The charge trapping layers are formed on sidewalls of the stacked structures. The bit lines are arranged orthogonally over the stacked structures, and surfaces of the bit lines crossing the stacked structures form a plurality of memory elements. The stairstep structures are stacked on the substrate, and each of the stairstep structures is electrically connected to different ones of the gates.

According to another embodiment of the present disclosure, a manufacturing method of a 3D memory structure is provided. The manufacturing method includes the following steps: providing a substrate; forming a plurality of stacked structures on the substrate, each of the stacked structures comprising a plurality of gates and a plurality of gate insulators alternately stacked on the substrate; forming a plurality of charge trapping layers on sidewalls of the stacked structures; forming a plurality of bit lines arranged orthogonally over the stacked structures, surfaces of the bit lines crossing the stacked structures for forming a plurality of memory elements; and forming a plurality of stairstep structures stacked on the substrate, each of the stairstep structures electrically connected to different ones of the gates.

The above and other embodiments of the disclosure will become better understood with regard to the following detailed description of the non-limiting embodiment(s). The following description is made with reference to the accompanying drawings.

DETAILED DESCRIPTION

In the embodiments of the present disclosure, a 3D memory structure and a method of manufacturing the same are provided. In the embodiments, stairstep structures are electrically connected to different gates, and different planes of gates are selected by the stairstep structures, such that the area occupied by the whole memory array on the substrate (2D plane) can be reduced, and areas required for disposing contacts are reduced as well. The following embodiments are for the purpose of elaboration only, not for limiting the scope of protection of the invention. Besides, secondary elements are omitted in the following embodiments to highlight the technical features of the invention.

Figure 1:
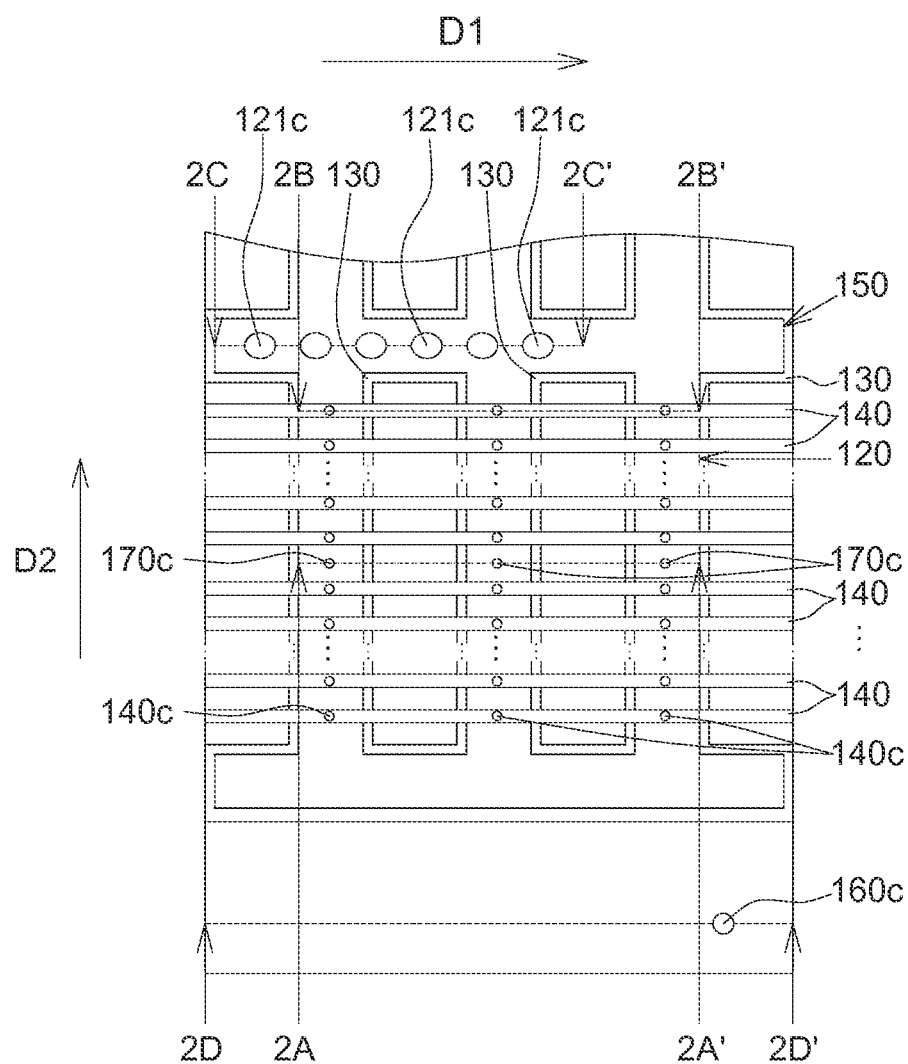
FIG. 1 shows a top view of a 3D memory structure according to an embodiment of the present disclosure.
Figure 2A:
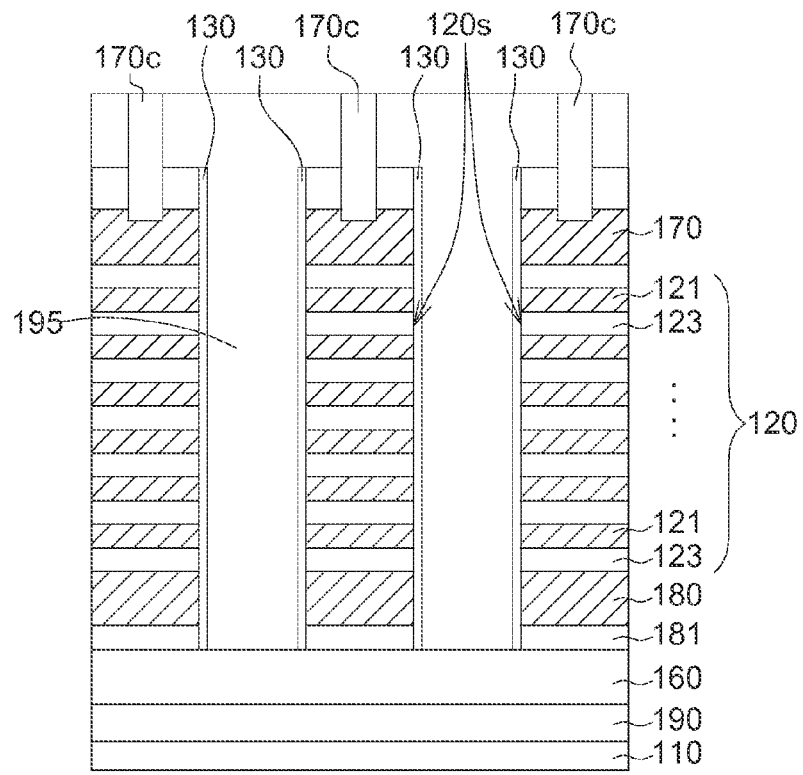
FIG. 2A is a cross-sectional view along the cross-sectional line 2A-2A'.
Figure 2B:
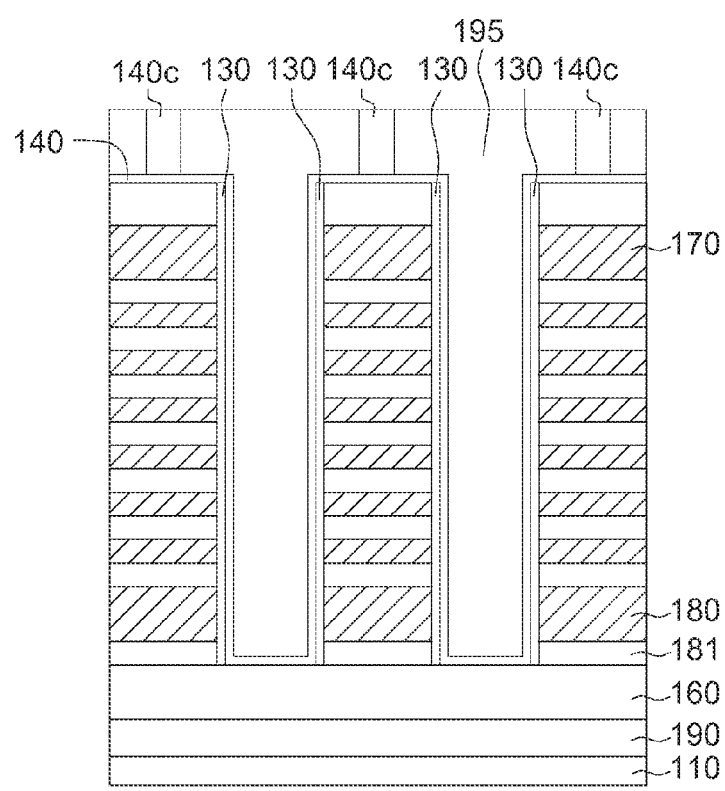
FIG. 2B is a cross-sectional view along the cross-sectional line 2B-2B'.
Figure 2C:
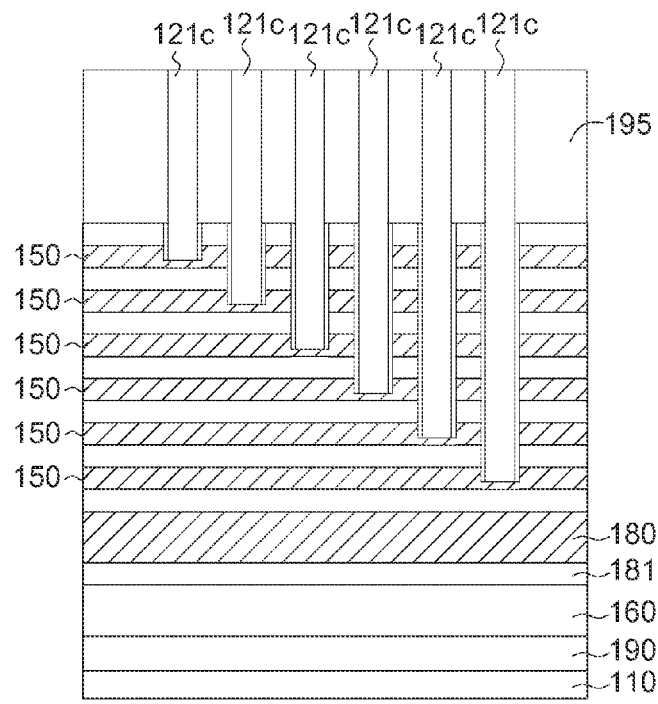
FIG. 2C is a cross-sectional view along the cross-sectional line 2C-2C.
Figure 2D:
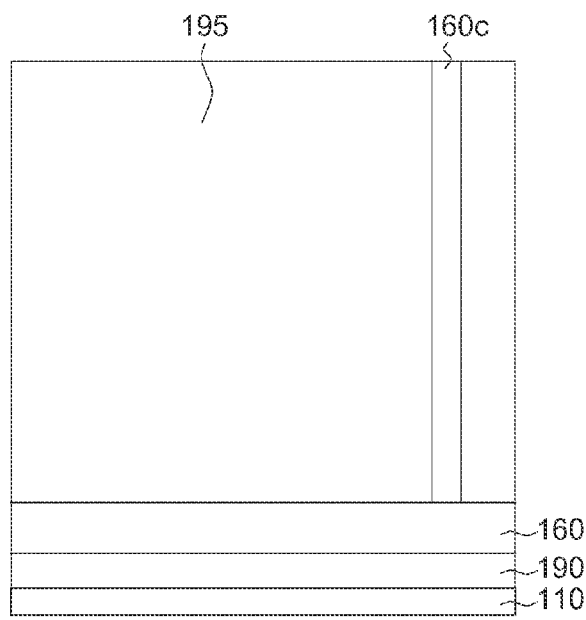
FIG. 2D is a cross-sectional view along the cross-sectional line 2D-2D'.

FIG. 1 shows a top view of a 3D memory structure 100 according to an embodiment of the present disclosure, FIG. 2A is a cross-sectional view along the cross-sectional line 2A-2A'. FIG. 2B is a cross-sectional view along the cross-sectional line 2B-2B', FIG. 2C is a cross-sectional view along the cross-sectional line 20-2C', and FIG. 2D is a cross-sectional view along the cross-sectional line 2D-2D'.

As shown in FIGS. 1 and 2A-2C, the 3D memory structure 100 includes a substrate 110, a plurality of stacked structures 120, a plurality of charge trapping layers 130, a plurality of bit lines 140, and a plurality of stairstep structure 150. The stacked structures 120 are formed on the substrate 110, and each of the stacked structures 120 comprises a plurality of gates 121 and a plurality of gate insulators 123 alternately stacked on the substrate 110. The charge trapping layers 130 are formed on sidewalls 120s of the stacked structures 120. The bit lines 140 are arranged orthogonally over the stacked structures 120, and surfaces of the bit lines 140 cross the stacked structures 120 for forming a plurality of memory elements, thereby constructing a 3D memory array. The stairstep structures 150 are stacked on the substrate 110, and each of the stairstep structures 150 is electrically connected to different ones of the gates 121.

In one embodiment, the gates 121 of the same plane in the stacked structures 120 are electrically coupled via a corresponding stairstep structure 150, and the gates 121 are such as the word lines of the 3D memory structure 100. In other words, each stairstep structure 150 is connected to different gates 121 (word lines), and the word lines are for connecting to a decoding circuit for selecting a plane in the 3D memory array. As such, the gates 121 (word lines) of different planes are selected via the stairstep structure 150, such that the area occupied by the whole memory array on the substrate 110 (2D plane) can be reduced, and areas required for disposing contacts are reduced as well.

In the embodiments, the bit lines 140 are formed from semiconductor materials, such as polysilicon, Ge, SiGe, and so on.

As shown in FIGS. 2A-2D, the 3D memory structure 100 may further include a bottom source layer 160, source contact structures 160c, and an oxide layer 190. The bottom source layer 160 is formed on the substrate 110 and located between the stacked structures 120 and the substrate 110. The oxide layer 190 separates the bottom source layer 160 from the substrate 110. In the embodiment, the bottom source layer 160 is formed from conductive materials, such as polysilicon, heavily-doped polysilicon, Ti, TiN, or W. In one embodiment, the source contact structures 160c are electrically connected to the bottom source layer 160. The source contact structures 160c are electrically connected via the bottom source layer 160.

As shown in FIGS. 1 and 2C, the 3D memory structure 100 may further include a plurality of gate contact structures 121c. Each of the gate contact structures 120c is electrically connected to the corresponding gate 121 via each of the stairstep structures 150. In the embodiment, the gate contact structures 121c are arranged along a direction D1 in which the bit lines 140 are extended.

According to the embodiments of the present disclosure, the stairstep structures 150 are electrically connected to different gates 121 (word lines), respectively, for selecting planes in the 3D memory array. In addition, the gate contact structures 121c are arranged along the direction D1 in which the bit lines 140 are extended, and the gate contact structures 121c are not arranged along a direction D2 in which the stacked structures 120 are extended. Accordingly, the ratio of the area occupied by the stairstep structures 150 in combination with the gate contact structures 121c to the area occupied by the stacked structures 120 on the 2D plane of the 3D memory array can be minimized. As such, the areas occupied by the stacked structures 120, the stairstep structures 150, and the gate contact structures 121c as a whole (3D memory array) on the substrate (2D plane) can be reduced, and areas required for disposing contacts are reduced as well.

As shown in FIGS. 1 and 23, the 3D memory structure 100 may further include a plurality of bit line contact structures 140c, and each of the bit line contact structures 140c is electrically connected to each of the bit lines 140.

As shown in FIGS. 1 and 2A-2B, the 3D memory structure 100 may further include a plurality of selection lines 170 above the gates 121 and spaced apart from one another. The selection lines 170 are independently controlled. The selection lines 170 are insulated from one another, and the selection lines 170 are insulated from the gates 121 by the gate insulators 123. In the embodiment, the gates 121 and the selection lines 170 are formed from conductive materials, and the layer of the selection lines 170 is thicker than the layer of each gate 121, but the disclosure is not limited thereto. For example, the thickness of the selection lines 170 is such as 0.05-0.5 μm, and the thickness of the gates 121 is such as 10-100 nm. In the embodiment, the gates 121 include polysilicon, such as heavily-doped polysilicon. The gate insulators 123 include silicon oxide.

According to the embodiments of the present disclosure, each of the stacked structures 120 is directly connected to and terminated at the stairstep structures 150, and the gate contact structures 121c are arranged along the direction D1 in which the bit lines 140 are extended, resulting in a very short distance between the gate contact structures 121c and the gates 121. As such, the gates 121 and the selection lines 170 can electrically connect to contacts without having very long extensions along the direction D2 in which the stacked structures 120 are extended. Therefore, the stacked structures 120, particularly the selection lines 170 and the ground selection lines 180 which will be discussed later, can have a relatively short length. Accordingly, the area occupied by the whole memory array can be minimized, and the word lines (gates 121) and the selection lines 170 (as well as the ground selection lines 180) can have smaller resistance; as such, the dispositions of extra conductive materials or elements for lowering the resistance of the word lines and the selection lines are needless and thus avoided.

In the embodiments, the 3D memory structure 100 may further include a plurality of selection line contact structures 170c, and each of the selection line contact structures 170c is electrically connected to each of the selection lines 170. In the embodiments, the selection lines 170 are such as the string selection lines (SSL) of the 3D memory structure 100, and the selection line contact structures 170c are such as the SSL contacts. In the embodiment, as shown in FIG. 1, two sides of the selection line contacts 170c are disposed with 64 bit lines 140, respectively, and each group of the 64 bit lines 140 is located between the selection line contacts 170c and the stairstep structures 150. Each of the bit lines 140 is disposed with the bit line contact structures 140c corresponding to each of the stacked structures 120. Moreover, the arrangement of the combination of stairstep structure 150/bit lines 140/selection line contact structures 170c can be a repeating unit, and such repeating unit can be repeatedly arranged along the direction D2 in which the stacked structures 120 are extended. However, the selections of the number of the bit lines 140 and the number of the repeating units may vary depending on the conditions applied and are not limited thereto.

In the embodiment, the above-mentioned gate contact structures 121c, the bit line contact structures 140c, the source contact structures 160c, and the selection line contact structures 170c are formed from conductive materials or semiconductor materials, such as polysilicon, Si, Ge, SiGe, and so on. However, the selections of the materials of the above-mentioned elements may vary depending on the conditions applied and are not limited thereto.

As shown in FIGS. 2A-2C, the 3D memory structure 100 may further include ground selection lines (GSL) 180 on the substrate 110. In the embodiment, the ground selection lines 180 are insulated form the bottom source layer 160 by the oxide layer 181. In the embodiment, the ground selection lines 180 are formed from conductive materials, such as heavily-doped polysilicon. The layer of the ground selection lines 180 is thicker than the layer of each gate 121, but the disclosure is not limited thereto. For example, the thickness of the layer of the ground selection lines 180 is about 0.05-0.5 μm.

As shown in FIGS. 2A-2D, the 3D memory structure 100 may further include an interlayer dielectric (ILD) 195 filled outside the bit lines 140 and between the stacked structures 120. In the embodiment, the ILD 195 is formed from dielectric materials, such as BPSG, HEP OX, PEOX, TEOS, and so on. In the embodiment, the dielectric material of the ILD 195 has a low dielectric constant, such as 2-15.

In the embodiments, the charge trapping layers 130 may be ONO composite layers or ONONO composite layers and are not limited thereto. In one embodiment, the charge trapping layer 130 includes a blocking layer, a charge storage layer, and a tunneling layer (not shown). The blocking layer is formed on the sidewalls 120s of the stacked structures 120, the charge storage layer is formed on the blocking layer, and the tunneling layer is formed on the charge storage layer. In the embodiment, the blocking layer is such as a silicon oxide layer with a thickness of 50-200 Å, and the charge storage layer is such as a silicon nitride layer with a thickness of 40-200 Å. The tunneling layer is such as an ONO layer, wherein the two silicon oxide layers have thicknesses of 5-40 Å and 5-15 Å, respectively, and the silicon nitride layer has a thickness of 5-30 Å.

In one embodiment, as shown in FIGS. 2A-B, the charge trapping layers 130 cover the surfaces of the sidewalls of the gates 121 and the surfaces of the sidewalls of the gate insulators 123. Also, the charge trapping layers 130 cover the surfaces of the sidewalls of the selection lines 170 and the surfaces of the sidewalls of the ground selection lines 180.

Figure 3:
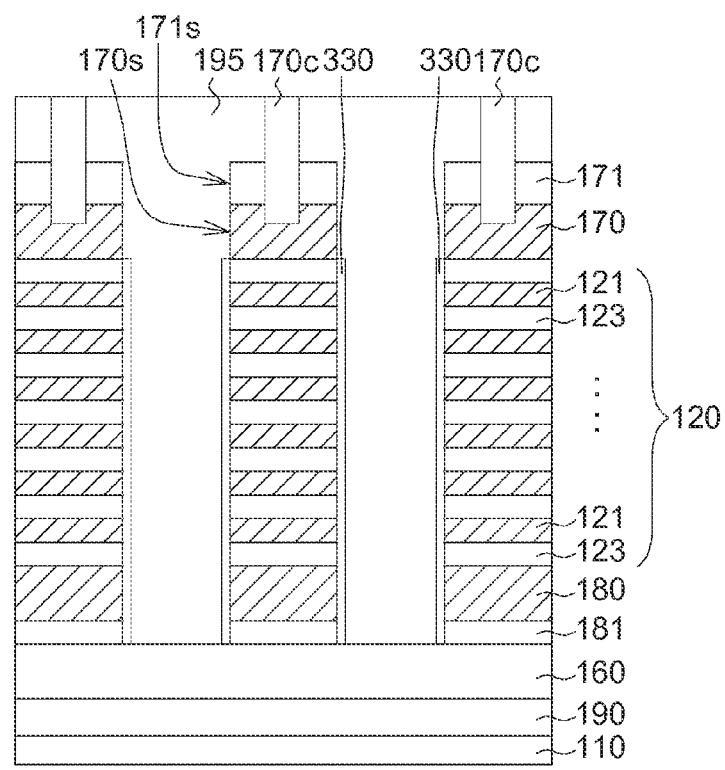
FIG. 3 is a cross-sectional view along the cross-sectional line 2A-2A' according to another embodiment of the present disclosure.

FIG. 3 is a cross-sectional view along the cross-sectional line 2A-2A' according to another embodiment of the present disclosure. In the present embodiment, the charge trapping layers 330 cover the sidewalls of the gates 121 and the sidewalls of the gate insulators 123, while the sidewalls 170s of the selection lines 170 are exposed from the charge trapping layers 330. In addition, the sidewalls 171s of the oxide layers 171 disposed above the selection lines 170 are also exposed from the charge trapping layers 330. The selection lines 170 are used for controlling the gates 121, that is, the selection lines 170 are not regarded as storage elements. Therefore, the sidewalls 170s of the selection lines 170 exposed from the charge trapping layers 330 can prevent the occurrence of an undesired charge storage before the memory elements are operated, resulting in an unwanted increase of the initial threshold voltage. Moreover, the surfaces of the sidewalls 170s of the selection lines 170 are not covered by the charge trapping layers 330, such that the corresponding gate insulators 123 can have a relatively smaller thickness, such as 50-70 Å; accordingly, the operation voltage of the 3D memory structure is decreased, and the controlling ability of the selection lines 170 over the gates 121 is further improved.

According to the embodiments of the present disclosure, in the 3D memory structure 100, different word lines (gates 121) are electrically connected to different stairstep structures 150, therefore, the gate contact structures 121c allow a word line signal to select a particular horizontal plane of the word lines (gates 121) via the stairstep structures 150. Meanwhile, a particular bit line 140 is selected via the bit line contact structures 140c, and a particular stacked structure 120 is selected via the selection line contact structures 170c from the selection lines 170. As such, it is sufficient to select a particular memory cell (memory element) from the 3D array of memory cells.

Compared to a known 3D vertical gate type memory structure, in the embodiments of the present disclosure, the 3D memory structure is vertical channel type. The distance between the selection lines 170 and the top of the device is short; therefore, it is convenient to perform an implantation process on the selection lines 170 for lowering the resistance thereof, with a better implantation precision achieved. Moreover, the distance between the word lines (gates 121) is relatively short, thereby the issues of high resistance is avoided, and the regions between the word lines can be turned on easily in operation.

Figure 4A:
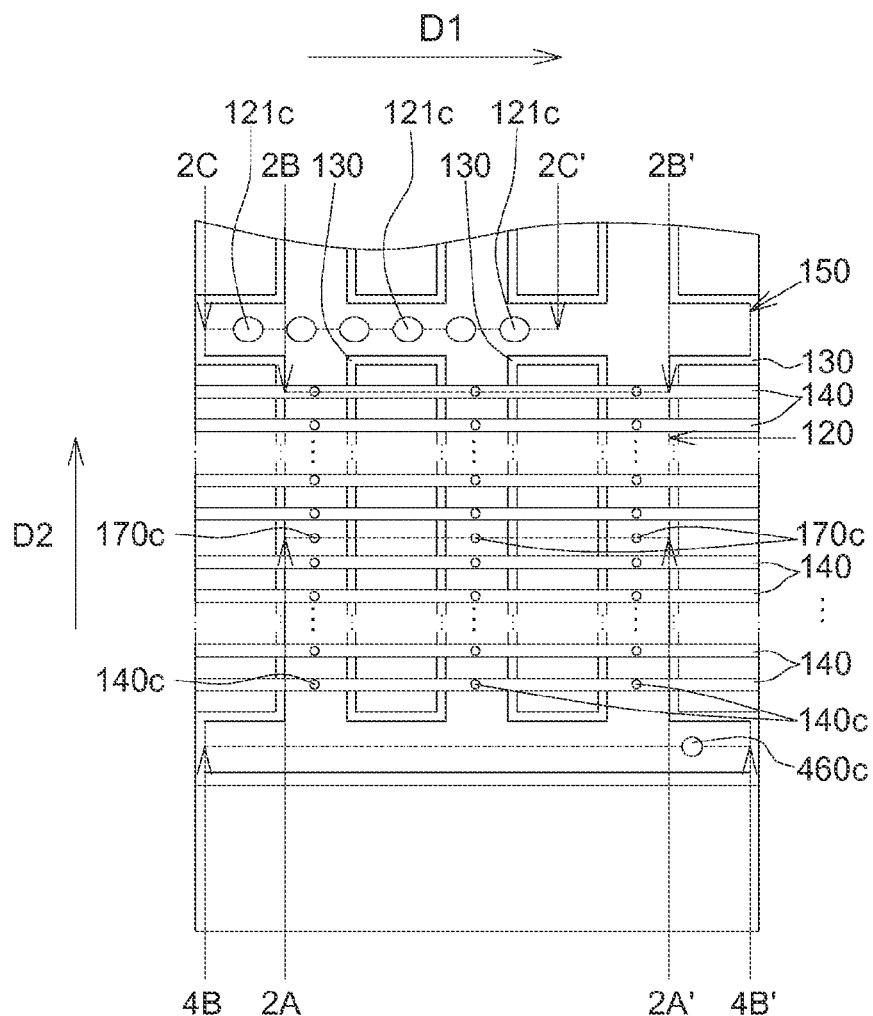
FIG. 4A shows a top view of a 3D memory structure according to a further embodiment of the present disclosure.
Figure 4B:
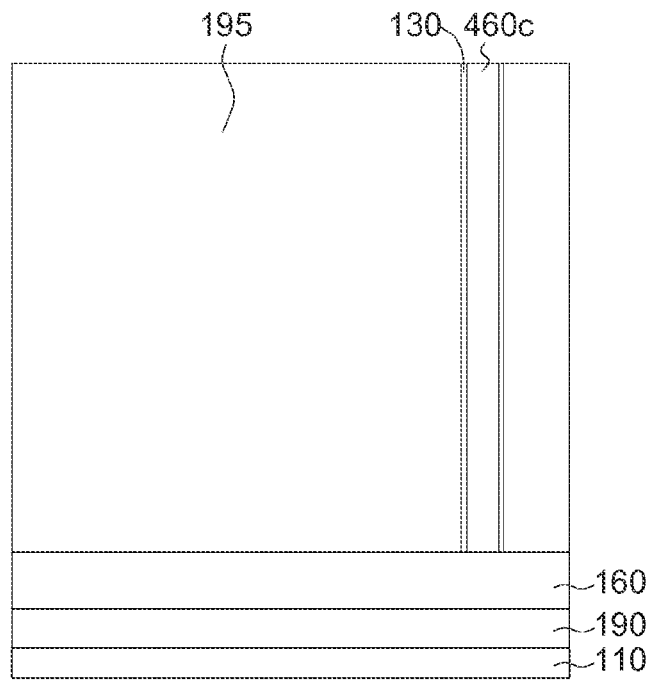
FIG. 4B is a cross-sectional view along the cross-sectional line 4B-4B'.

FIG. 4A shows a top view of a 3D memory structure 200 according to a further embodiment of the present disclosure, and FIG. 4B is a cross-sectional view along the cross-sectional line 4B-4B'. The difference between the present embodiment and the embodiment illustrated in FIGS. 1 and 2A-2D is that the source contact structure 460c of the present embodiment can be disposed corresponding to where the stairstep structures 150 are located. The source contact structures 460c can be electrically connected via back-end metal lines (not shown). The similarities between the present embodiment and the previous ones are not repeated.

FIGS. 5A-14 illustrate a manufacturing method of a 3D memory structure 100 according to an embodiment of the present disclosure.

Referring to FIGS. 5A-6B, the substrate 110 is provided, and the stacked structures 120 are formed on the substrate 110. In the embodiment, the manufacturing process of the stacked structures 120 includes such as the following steps.

Figure 5A:
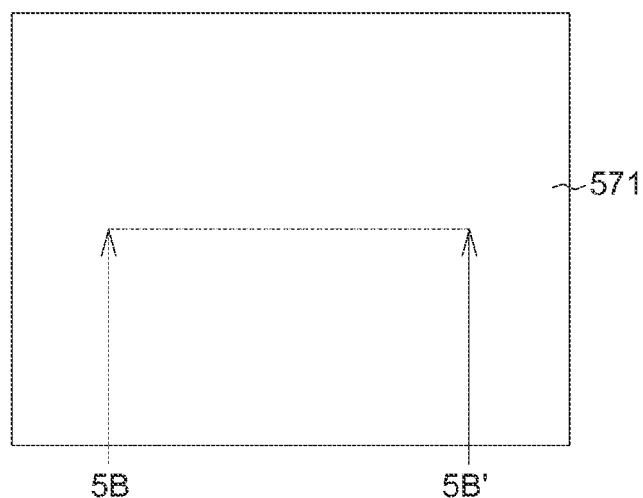
FIGS. 5A-14 illustrate a manufacturing method of a 3D memory structure according to an embodiment of the present disclosure.
Figure 5B:
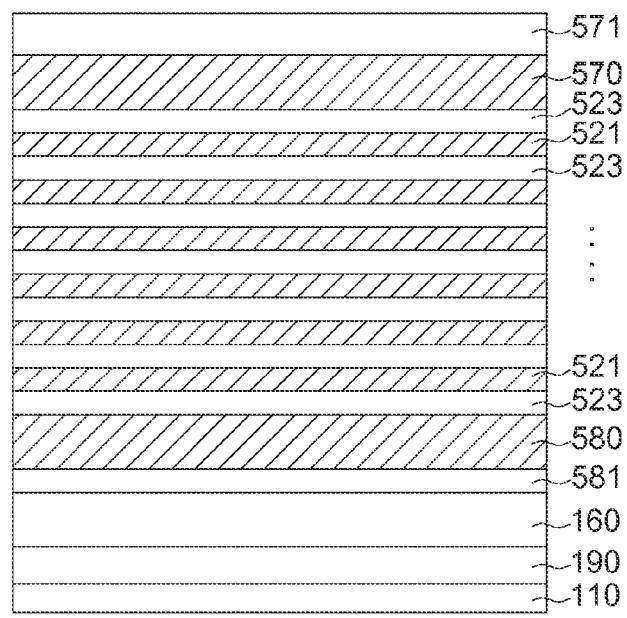

As shown in FIGS. 5A-5B (FIG. 5B is a cross-sectional view along the cross-sectional line 5B-5B'), a plurality of conductive layers 520 and a plurality of insulating layers 523 are alternatively stacked on the substrate 110. In the embodiment, the bottom source layer 160 and the oxide layer 190 may be further formed on the substrate 110, the bottom source layer 160 is formed between the conductive layers 521 the substrate 110, and the oxide layer 190 is formed between the bottom source layer 160 and the substrate 110. In the embodiment, an oxide layer 581 and a conductive material layer 58 may be further formed on the substrate 110, and the conductive material layer 580 is isolated from the bottom source layer 160 by the oxide layer 581. In the embodiment, an oxide layer 571 and a conductive material layer 570 may be further formed on the conductive layers 521 and the insulating layers 523.

Figure 6A:
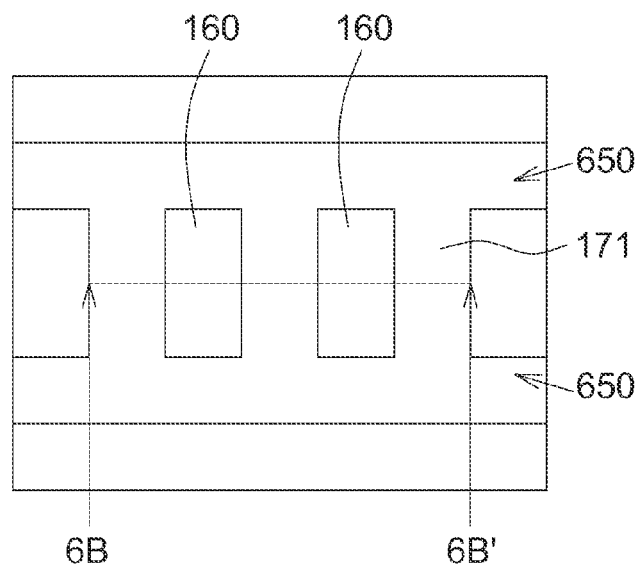
Figure 6B:
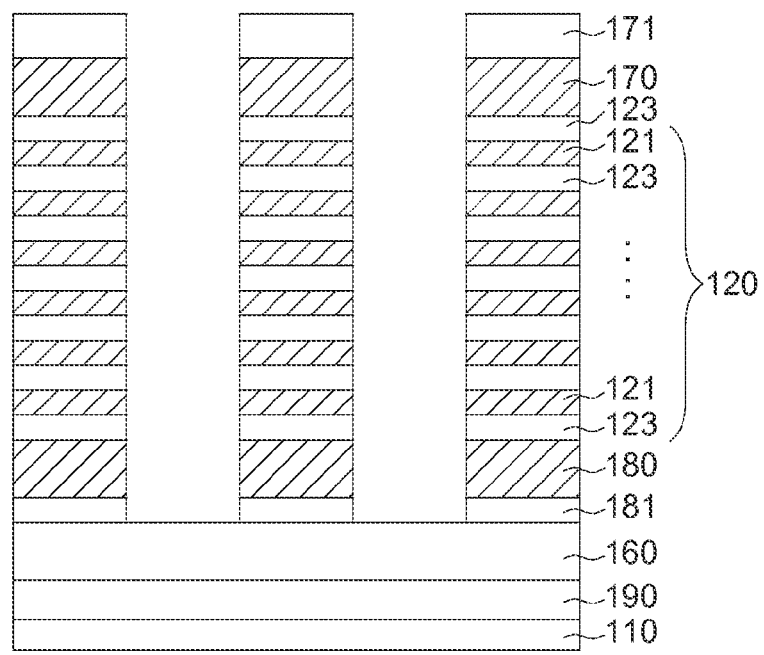

As shown in FIGS. 6A-6B (FIG. 6B is a cross-sectional view along the cross-sectional line 6B-6B'), the oxide layer 571, the conductive material layer 570, the conductive layers 521, the insulating layers 523, the oxide layer 581, and the conductive material layer 580 are patterned. In the embodiment, the patterning may be performed by an etching process, and the bottom source layer 160 having a relative large thickness may be used as an etching stop layer. As such, the stacked structures 120 are formed on the substrate 110, each stacked structure 120 including the gates 121 and the gate insulators 123 alternatively stacked on the substrate 110. The gates 121 are formed of polysilicon, and the gate insulators 123 are formed of silicon oxide. Meanwhile, the bottom source layer 160 is formed between the stacked structure 120 and the substrate 110, the selection lines 170 and the oxide layer 171 are formed separately on the gates 121, and the selection lines 180 and the oxide layer 181 are formed on the substrate 110. As shown in FIG. 6A, the region 650 is where the stairstep structures 150 are predetermined to be formed, and at the current step, the stairstep structures 150 are formed all together, with some needless overlying layers remained to be removed in the following steps. In other words, in the present embodiment, the gates 121 and the stairstep structures 150 may be formed in the same manufacturing process, and both of which are formed from the conductive layers 521.

Figure 7A:
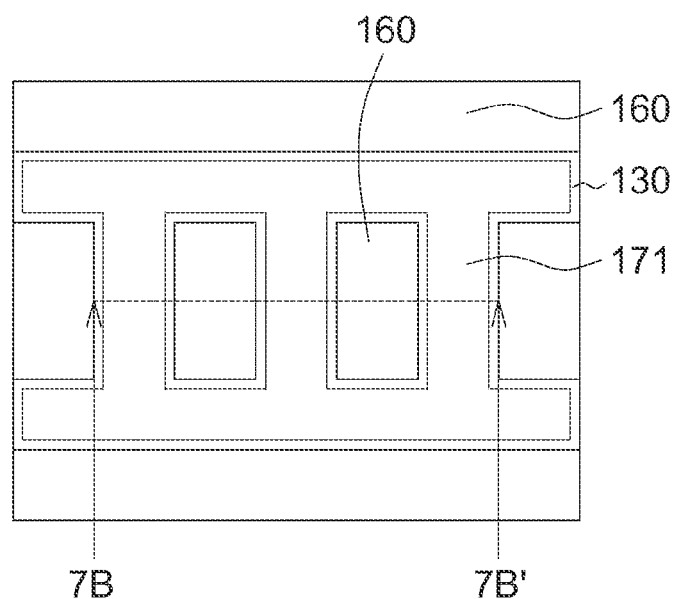
Figure 7B:
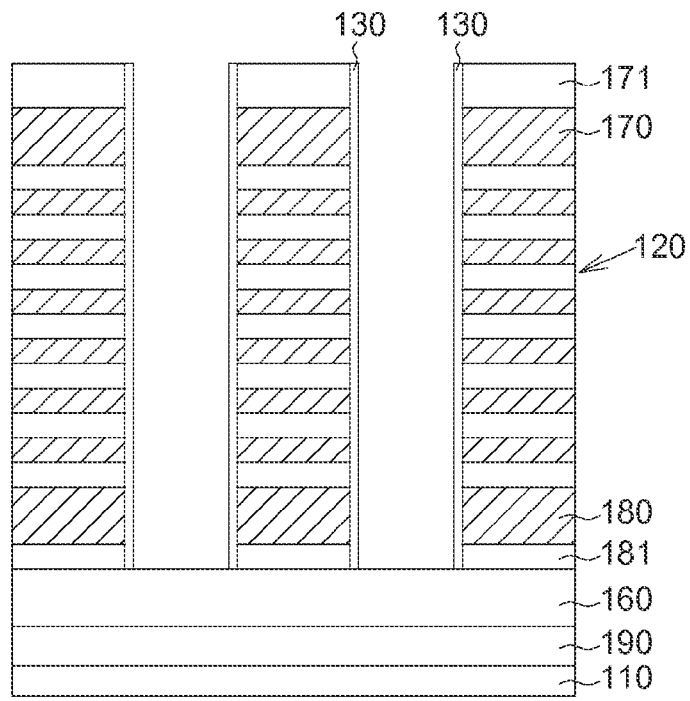

Next, referring to FIGS. 7A-7B (FIG. 7B is a cross-sectional view along the cross-sectional line 7B-7B'), the charge trapping layers 130 are formed on the sidewalls of the stacked structures 120. In the embodiment, the manufacturing process of the charge trapping layer 130 includes such as the following steps. The blocking layer is formed on the sidewalls of the stacked structures 120, the charge storage layer is formed on the blocking layer, and the tunneling layer is formed on the charge storage layer. In the embodiment, as shown in FIG. 7B, the charge trapping layers 130 are also formed on the sidewalls of the selection lines 170 and the oxide layer 171. In the embodiment, the charge trapping layer 130 may be formed by such as forming an overall charge trapping material layer on the stacked structures 120, followed by removal of a portion of the charge trapping material layer on the top surface of the oxide layer 171 and on the surface of the substrate 110 by an etching process.

In another embodiment, a portion of the charge trapping layers on the sidewalls of the selection lines 170 may be optionally removed for forming the charge trapping layers 330, as shown in FIG. 3, for exposing the surfaces of the sidewalls 170s of the selection lines 170.

Next, referring to FIGS. 8A-11B, the bit lines 140 are formed and arranged orthogonally over the stacked structures 120. In the embodiment, the manufacturing process of the bit lines 140 includes such as the following steps.

Figure 8A:
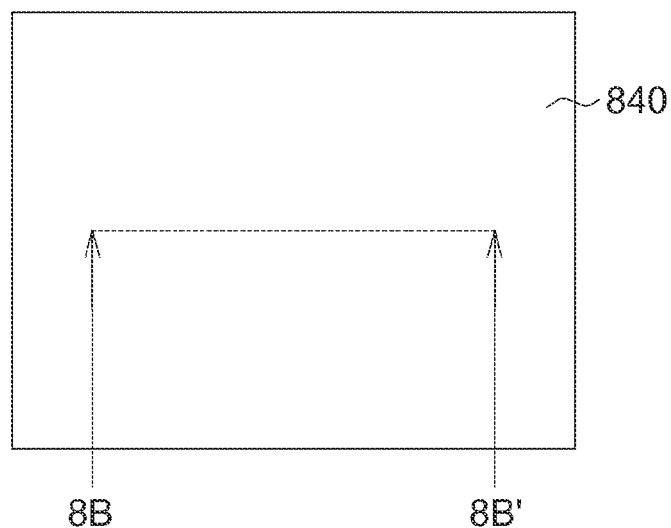
Figure 8B:
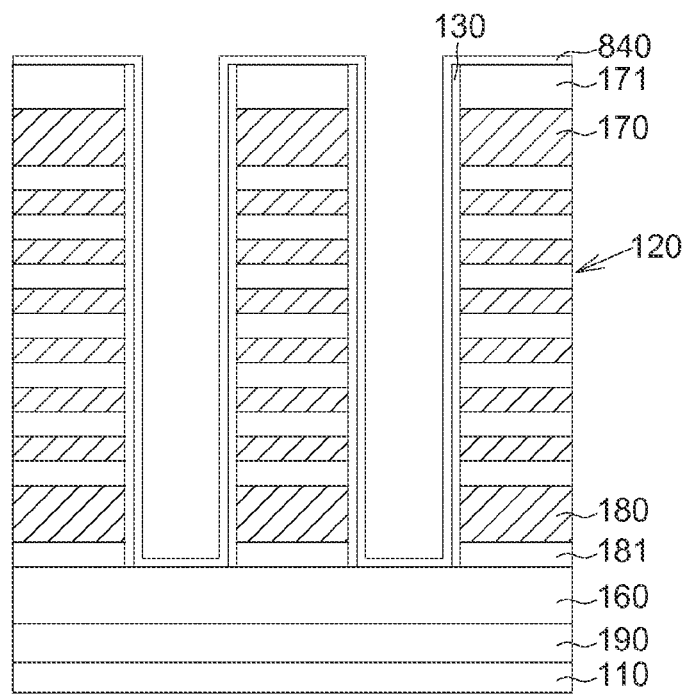

As shown in FIGS. 8A-8B (FIG. 8B is a cross-sectional view along the cross-sectional line 8B-8B'), a semiconductor material layer 840 is formed and covering the whole surface of the substrate 110, the oxide layer 171, and the charge trapping layers 130.

Figure 9A:
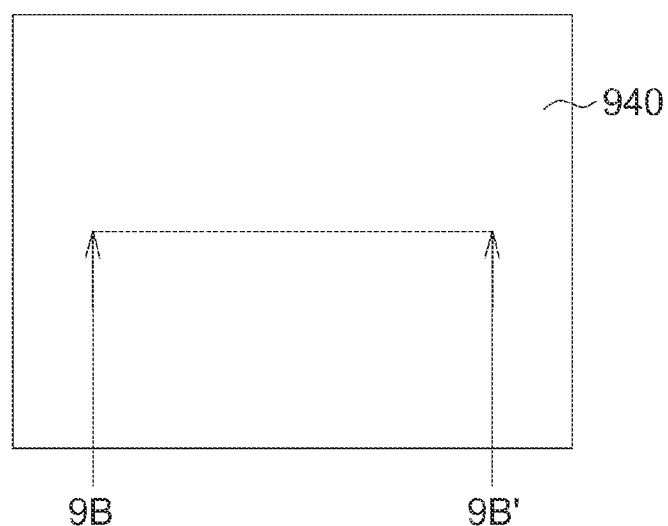
Figure 9B:
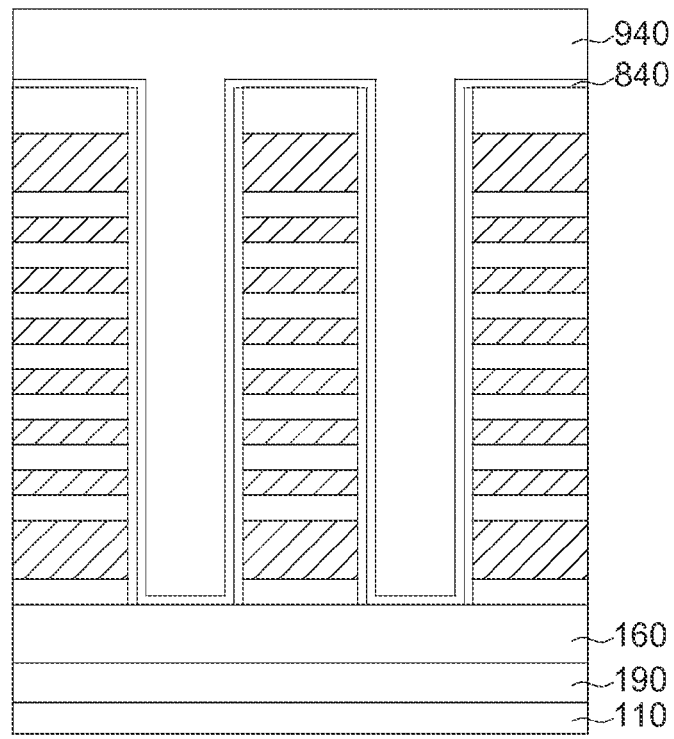

As shown in FIGS. 9A-9B (FIG. 9B is a cross-sectional view along the cross-sectional line 9B-9B'), a mask layer 940 is formed on the semiconductor material layer 840. The mask layer 940 may be a hard mask or an organic material mask layer. The organic material mask layer is such as Topaz or a composite layer of organic dielectric layer (ODL)/silicon-containing hard mask bottom antireflection coating (SHB). Since the stacked structures 120 have a relatively high height, and the focusing ability of a conventional yellow light manufacturing process is limited; accordingly, it is difficult to completely pattern the semiconductor material layer 840, and thus a complete patterning of the semiconductor material layer 840 is more likely to be performed by using a patterned hard mask layer or a patterned organic material mask layer. Particularly, as the semiconductor material layer 840 is patterned by using a patterned organic material mask layer, the organic material mask layer can be easily removed after the patterning process, and the structure of the underlying layer (e.g. semiconductor material layer 840) is not damaged.

In the embodiment, the composite layer of ODL/SHB is applied by forming the ODL on the semiconductor material layer 840, followed by forming the SHB on the ODL. And then, the semiconductor material layer 840 is patterned according to the composite layer of ODL/SHB. As such, the effect of a complete patterning from the SHB is achieved; in addition, the ODL and the SHB formed thereon can be easily removed from the semiconductor material layer 840, such that the structure of the semiconductor material layer 840 is not damaged.

Figure 10:
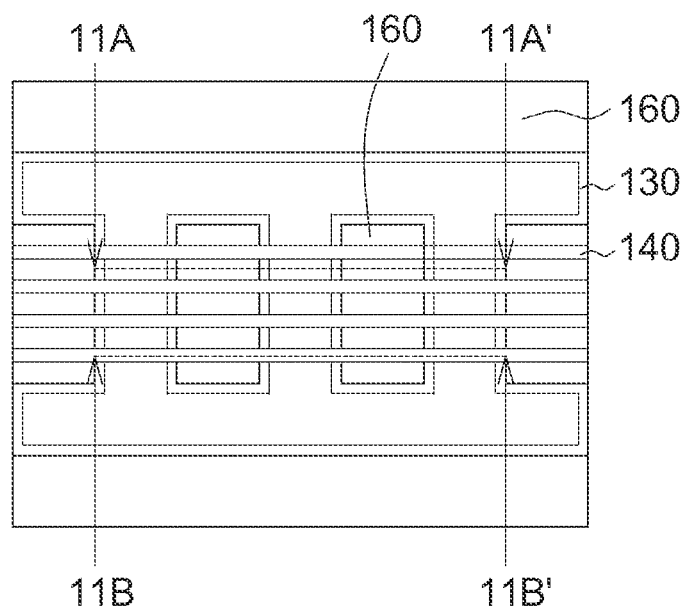
Figure 11A:
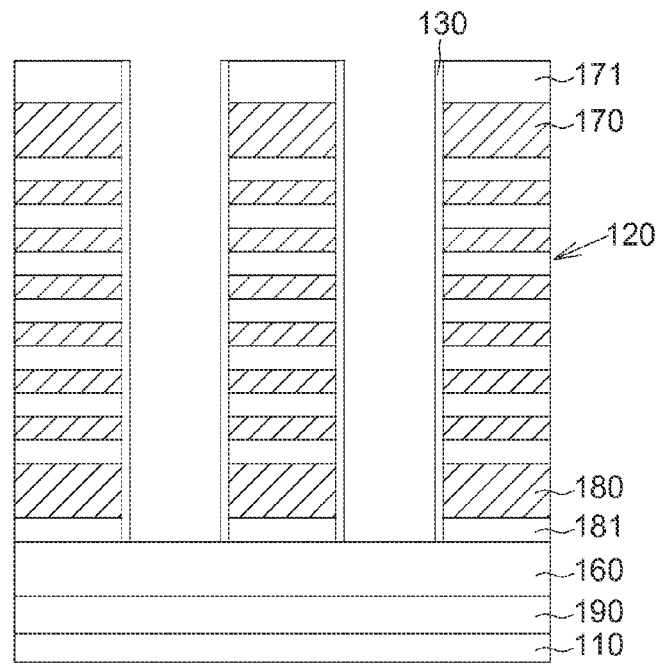
Figure 11B:
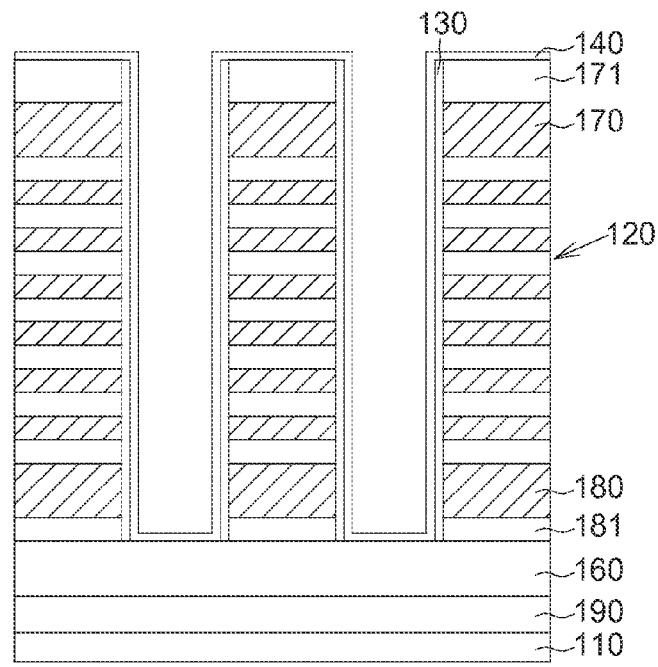

As shown in FIGS. 10-11B (FIG. 11A is a cross-sectional view along the cross-sectional line 11A-11A', and FIG. 11B is a cross-sectional view along the cross-sectional line 11B-11B'), the mask layer 940 is patterned, and the semiconductor material layer 840 is patterned according to the patterned mask layer 940 for forming the bit lines 140. And then, the patterned mask layer is removed. It is noted that only four bit lines are shown in the present drawing. However, the amount is merely for clearly showing the manufacturing process and is not intended to limit the amount of the bit lines 140 thereto.

Figure 12:
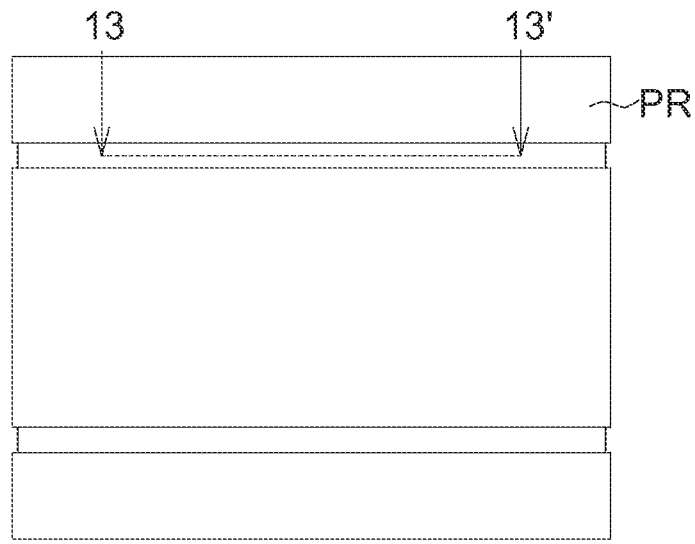
Figure 13:
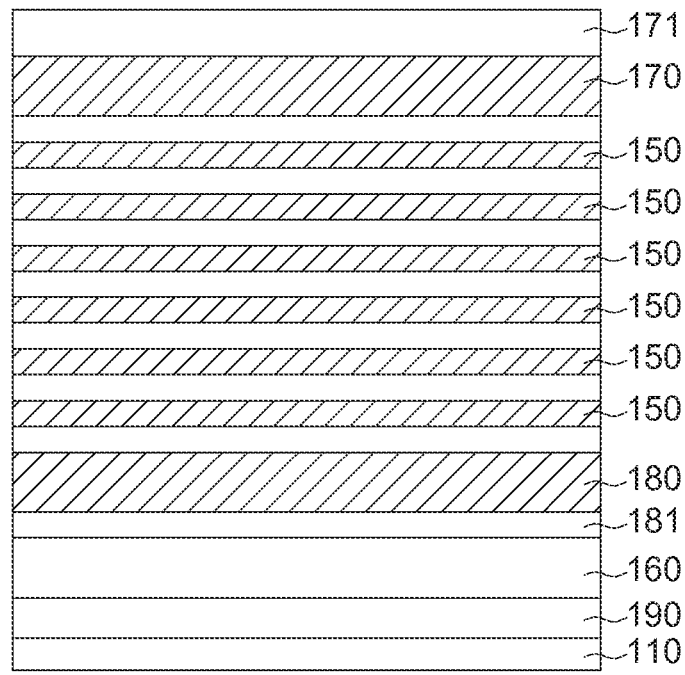
Figure 14:
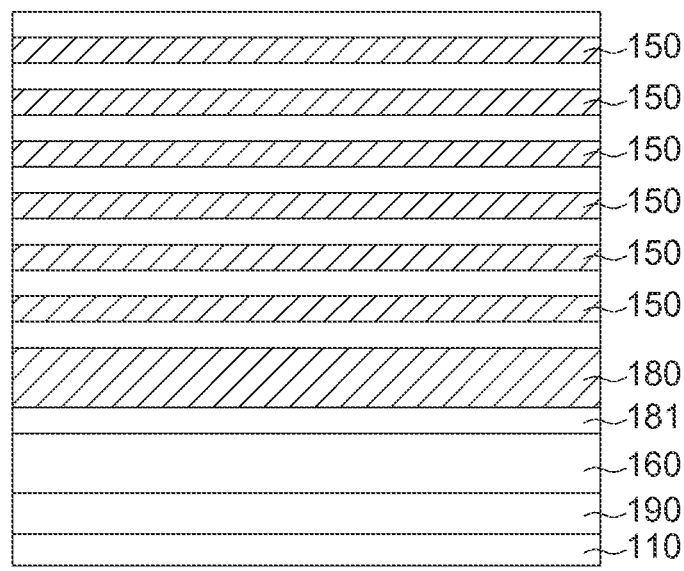

Next, referring to FIGS. 12-14 (FIGS. 13 and 14 are cross-sectional views along the cross-sectional line 13-13' in different manufacturing steps), the stairstep structures 150 are stacked on the substrate 110, and each of the stairstep structures 150 is electrically connected to different gates 121. In the embodiment, the manufacturing process of the stairstep structures 150 includes such as the following steps.

As shown in FIG. 12, a patterned photoresist PR is disposed on the oxide layer 171, which exposes a partial surface of the oxide layer 171 that is predetermined as the region for the stairstep structures 150 to be formed therein. And then, as shown in FIGS. 13-14, the portions of the oxide layer 171 and the selection lines 170 exposed from the patterned photoresist PR are removed. In the embodiment, the removal is performed by such as an etching process.

Next, the interlayer dielectric 195 is formed. The interlayer dielectric 195 is filled outside the bit lines 140 and between the stacked structures 120. In the embodiment, the interlayer dielectric 195 is formed by such as depositing a dielectric material layer covering the bit lines 140 and between the stacked structures 120, followed by a planarization of the dielectric material layer. The planarization of the interlayer dielectric 195 is performed by such as a CMP process.

Next, referring to FIGS. 1 and 2A-2D, the gate contact structures 121c, the bit line contact structures 140c, the source contact structures 160c, and the selection line contact structures 170c are formed. In the embodiment, the contact structures are formed by such as a MiLC process. As such, the 3D memory structure 100 as shown in FIGS. 1 and 2A-2D is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A 3D memory structure, comprising:
a substrate;
a plurality of stacked structures formed on the substrate, each of the stacked structures comprises:
a plurality of gates and a plurality of gate insulators alternately stacked on the substrate;
a plurality of charge trapping layers formed on sidewalls of the stacked structures;
a plurality of bit lines arranged orthogonally over the stacked structures, surfaces of the bit lines crossing the stacked structures for forming a plurality of memory elements;
a plurality of stairstep structures stacked on the substrate, each of the stairstep structures electrically connected to different ones of the gates; and
a plurality of gate contact structures, each of the gate contact structures electrically connected to the corresponding gate via each of the stairstep structures.

2. The 3D memory structure according to claim 1, further comprising:
a bottom source layer formed on the substrate and between the stacked structures and the substrate; and
a source contact structure electrically connected to the bottom source layer.

3. The 3D memory structure according to claim 1, wherein the gate contact structures are arranged along a direction which the bit lines are extended in.

4. The 3D memory structure according to claim 1, further comprising:
a plurality of selection lines formed above the gates and spaced apart from one another, wherein the selection lines are independently controlled, the selection lines are insulated from one another, and the selection lines are insulated from the gates.

5. The 3D memory structure according to claim 4, further comprising:
a plurality of selection line contact structures electrically connected to the selection lines.

6. The 3D memory structure according to claim 4, wherein the charge trapping layers cover sidewalls of the gates and sidewalls of the gate insulators and expose sidewalls of the selection lines.

7. The 3D memory structure according to claim 1, wherein each of the charge trapping layers comprises:
a blocking layer formed on the sidewalls of the stacked structures;
a charge storage layer formed on the blocking layer; and
a tunneling layer formed on the charge storage layer.

8. The 3D memory structure according to claim 1, wherein the gates comprises polysilicon, and the gate insulators comprises silicon oxide.

9. A 3D memory structure, comprising:
a substrate;
a plurality of stacked structures formed on the substrate, each of the stacked structures comprises:
a plurality of gates and a plurality of gate insulators alternately stacked on the substrate;
a plurality of charge trapping layers formed on sidewalls of the stacked structures;
a plurality of bit lines arranged orthogonally over the stacked structures, surfaces of the bit lines crossing the stacked structures for forming a plurality of memory elements;
a plurality of stairstep structures stacked on the substrate, each of the stairstep structures electrically connected to different ones of the gates; and
a plurality of bit line contact structures electrically connected to the bit lines.

10. A manufacturing method of a 3D memory structure, comprising:
providing a substrate;
forming a plurality of stacked structures on the substrate, each of the stacked structures comprising:
a plurality of gates and a plurality of gate insulators alternately stacked on the substrate;
forming a plurality of charge trapping layers on sidewalls of the stacked structures;
forming a plurality of bit lines arranged orthogonally over the stacked structures, surfaces of the bit lines crossing the stacked structures for forming a plurality of memory elements;
forming a plurality of stairstep structures stacked on the substrate, each of the stairstep structures electrically connected to different ones of the gates; and
forming a plurality of gate contact structures, each of the gate contact structures electrically connected to the corresponding gate via each of the stairstep structures.

11. The manufacturing method of the 3D memory structure according to claim 10, further comprising:
forming a bottom source layer on the substrate and between the stacked structures and the substrate; and
forming a source contact structure electrically connected to the bottom source layer.

12. The manufacturing method of the 3D memory structure according to claim 10, further comprising:
forming a plurality of bit line contact structures, wherein each of the bit line contact structures is electrically connected to each of the bit lines.

13. The manufacturing method of the 3D memory structure according to claim 10, further comprising:
forming a plurality of selection lines above the gates and spaced apart from one another, wherein the selection lines are independently controlled, the selection lines are insulated from one another, and the selection lines are insulated from the gates.

14. The manufacturing method of the 3D memory structure according to claim 13, further comprising:
forming a plurality of selection line contact structures, wherein each of the selection line contact structures is electrically connected to each of the selection lines.

15. The manufacturing method of the 3D memory structure according to claim 13, further comprising:
forming the charge trapping layers on the sidewalls of the stacked structures and sidewalls of the selection lines; and
removing a portion of the charge trapping layers on the sidewalls of the selection lines.

16. The manufacturing method of the 3D memory structure according to claim 10, wherein forming the charge trapping layers comprises:
forming a blocking layer on the sidewalls of the stacked structures;
forming a charge storage layer on the blocking layer; and
forming a tunneling layer on the charge storage layer.

17. The manufacturing method of the 3D memory structure according to claim 10, wherein the gates and the stairstep structures are formed in the same process.

18. The manufacturing method of the 3D memory structure according to claim 10, wherein the gates are formed of polysilicon, and the gate insulators are formed of silicon oxide.

* * * * *